(12) United States Patent
Schmitt et al.

(10) Patent No.: US 6,396,340 B1
(45) Date of Patent: May 28, 2002

(54) RF POWER AMPLIFIER SYSTEM EMPLOYING AC-DC POWER SUPPLIES AND RF COMBINING

(75) Inventors: Philip Charles Schmitt, Lebanon; Ky Thoai Luu, Mason, both of OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/668,079

(22) Filed: Sep. 22, 2000

(51) Int. Cl.[7] .................................................. H03F 3/38
(52) U.S. Cl. ..................... 330/10; 330/207 A; 330/297; 330/146
(58) Field of Search ............................... 330/10, 207 A, 330/251, 297, 146

(56) References Cited

U.S. PATENT DOCUMENTS

| | | | |
|---|---|---|---|
| 4,554,512 A | * 11/1985 | Aiello | 330/10 |
| 4,580,111 A | 4/1986 | Swanson | 332/41 |
| 4,949,050 A | * 8/1990 | Swanson | 330/146 |
| 5,612,647 A | * 3/1997 | Malec | 330/146 |
| 6,166,605 A | * 12/2000 | Carver | 330/297 |

* cited by examiner

*Primary Examiner*—Robert Pascal
*Assistant Examiner*—Khanh Van Nguyen
(74) *Attorney, Agent, or Firm*—Tarolli, Sundheim, Covell, Tummino & Szabo L.L.P.

(57) ABSTRACT

An RF power amplifier system is presented herein and it includes an RF source that provides an RF carrier signal having a given RF carrier frequency. An RF amplifier module amplifies the carrier signal and this module includes first and second RF amplifiers having a common input to receive a turn on signal that turns on both amplifiers and wherein the outputs of the amplifiers are coupled together in parallel. A controller supplies a turn on signal to the common input to turn on the first and second amplifiers. A first AC to DC supply provides a first DC operating voltage obtained from a first multiphase AC supply and applies this to the amplifier module and wherein the first DC voltage exhibits a ripple frequency dependent upon the number of phases in the first multiphase supply. Also, a second AC to DC supply is provided for supplying a second DC operating voltage from a second multiphase AC supply to the RF amplifier module and wherein the second DC operating voltage exhibits a ripple frequency dependent upon the number of phases in the second multiphase supply.

19 Claims, 5 Drawing Sheets

RF POWER AMPLIFIER SYSTEM EMPLOYING AC-DC POWER SUPPLIES AND RF COMBINING

BACKGROUND OF THE INVENTION

1. Technical Field

This invention relates to the art of AM radio broadcasting and, more particularly, to an RF power amplifier system having AC-DC power supplies using RF combining techniques.

2. Description of the Prior Art

The U.S. Patent to H. I. Swanson U.S. Pat. No. 4,580,111 discloses an amplitude modulator for use in AM radio broadcasting wherein the modulator serves to generate amplitude modulated signals by selectively turning on and off a plurality of RF amplifier modules to produce amplitude modulation. The amplifier modules include unit step modules that each, when on, provide an amplified voltage based on the operating voltage supplied to the amplifier. This operating voltage is a DC voltage obtained from rectifying a three phase AC input voltage. This operating voltage may be referred to as a B+ voltage.

It has been known in the prior art to provide B+ voltage as an operating voltage for amplifier modules by employing an AC to DC converter, referred to as an unregulated linear supply. Such a converter is illustrated herein at FIG. 2. This converter includes a transformer 100 having a delta connected primary winding network 102 connected to a three phase AC main line voltage supply, typically operating at 60 Hz. Two secondary winding arrangements 104 and 106 are provided. The secondary winding arrangements are respectively connected to fullwave rectifier assemblies 108 and 110 respectively. The rectifier assemblies 108 and 110 are frequently referred to as six-pulse rectifier assemblies. That is, in rectifying a three phase sinusoidal source six positive pulses are obtained for each cycle. These six positive pulses from the assemblies are combined with the use of an interphase transformer 112. The interphase transformer, together with a capacitor 114, provides the B+ operating voltage for a power amplifier module PAM-1 for supplying an amplified signal to a load L.

The limitations of the prior art in FIG. 2 include the requirement of step start contactors 120 and resistors 122 for each phase of the primary winding network 102 for on-off control and for in rush current limiting. Another limitation is the need for an interphase transformer 112 that combines the DC voltages from the two rectifier assemblies 108 and 110. The step start circuit adds extra expense to the system. The interphase transformer adds cost, reduces overall efficiency, and due to tolerance in the transformer and diodes, perfect balance of the transformer is not achievable. This results in an increase in the line current total harmonic distortion (THD) from a theoretical 7% up to approximately 12–15%. Combining DC supplies, such as that provided by rectifier assemblies 108 and 110, is difficult because any slight variation in voltage will cause a huge imbalance in current. The supply with the highest voltage will also supply the majority of the current. The interphase transformer (such as transformer 112 in FIG. 2) is the standard method of combining the output voltages obtained from two DC rectifier assemblies in a three phase system (to obtain a combined voltage having 12 pulses per cycle). The transformer works because the two rectifier assemblies are fed with AC voltages that are phased ±/±15 degrees of the main input phases. This allows each rectifier assembly to produce a DC voltage with a 360 Hz ripple. Since each rectifier assembly is out of phase from the other, the output voltages from the two rectifier assemblies can be combined by the interphase transformer creating a single DC voltage supply with a 720 Hz ripple. The interphase transformer acts as a balance. The rectifier assembly with the higher voltage will source the majority of the current, as the current in one side increases the effective impedance seen by the higher voltage rectifier assembly will increase causing a decrease in the effective output voltage and allowing the other rectifier assembly to start sharing the load.

The interphase transformer is constructed from copper and magnetic steel and is lossy, thereby lowering the overall system efficiency. Since the two rectifier assemblies are never going to be exactly alike (thus the need for the interphase transformer) the balance between the two halves will introduce line current harmonic distortions as the current balance in each rectifier assembly is increased. Theoretically, the ideal 12-pulse system should provide line current total harmonic distortion (THD) of 7%. As a practical matter this is never achieved and real world values of 15–20% are commonly seen. Line chokes and other methods can be employed to reduce the THD to 10% but these require extra components which add cost, lower efficiency, and are often large and bulky.

SUMMARY OF THE INVENTION

It is an object of the present invention to provide an AC-DC power supply with RF combining in such a manner that it eliminates the need for an interphase transformer and obviates the need for step start contactors and associated resistors.

In accordance with the present invention, an RF power amplifier system is provided that includes an RF source that provides an RF carrier signal having a given RF carrier frequency. An RF amplifier module amplifies the carrier signal and this module includes first and second RF amplifiers having a common input to receive a turn on signal that turns on both amplifiers. The outputs of the amplifiers are coupled together in parallel. A controller supplies a turn on signal to the common input to turn on the first and second amplifiers. A first AC to DC supply provides a first DC operating voltage obtained from a first multiphase AC supply and applies this to the amplifier module. The first DC voltage exhibits a ripple frequency dependent upon the number of phases in the first multiphase supply. A second AC to DC supply provides a second DC operating voltage from a second multiphase AC supply and applies this to the amplifier module. The second DC operating voltage exhibits a ripple frequency dependent upon the number of phases in the second multiphase supply.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF PREFERRED EMBODIMENT

Figure 1:
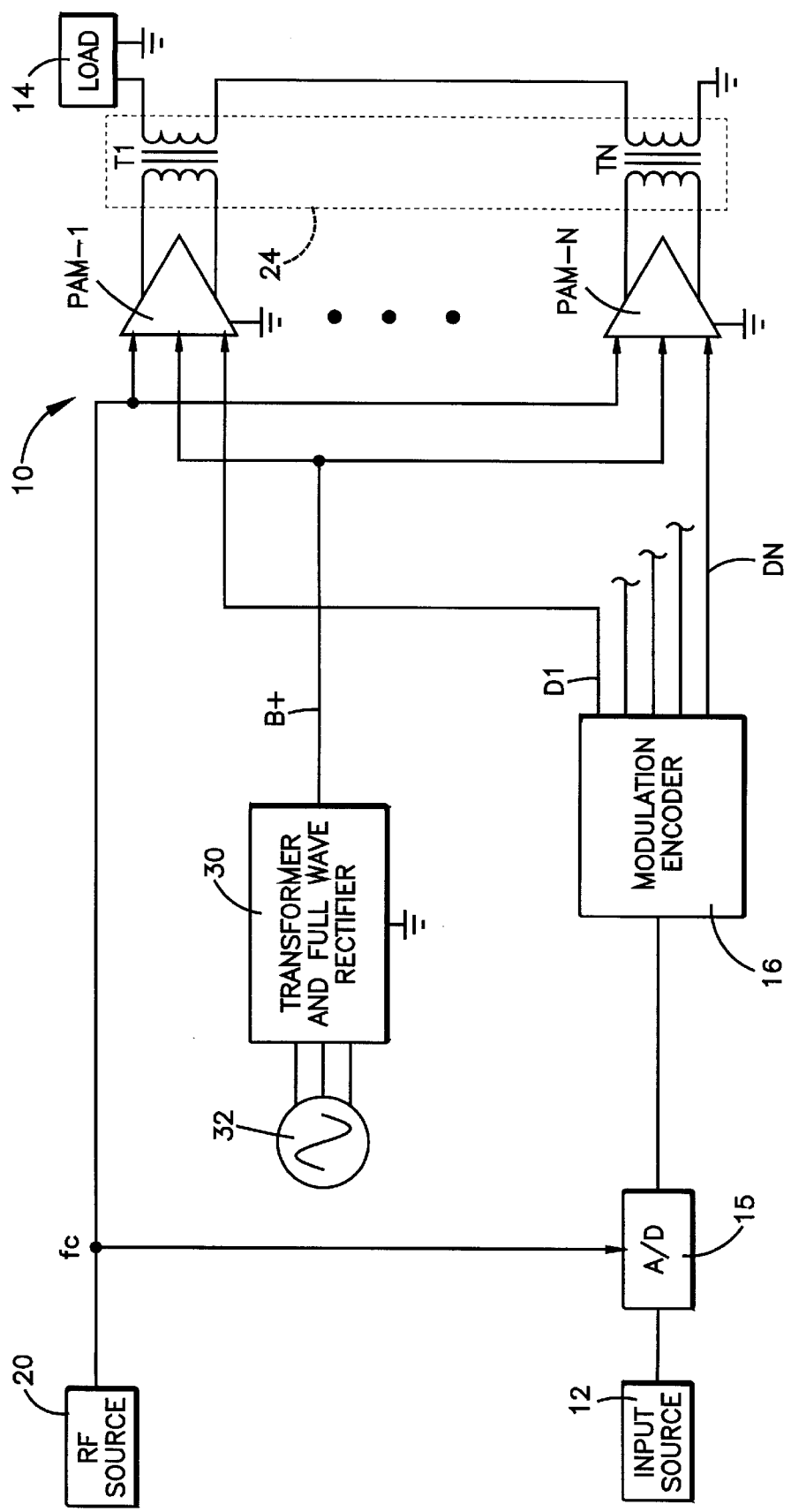
FIG. 1 is a schematic-block diagram illustration of a prior art system.
Figure 2:
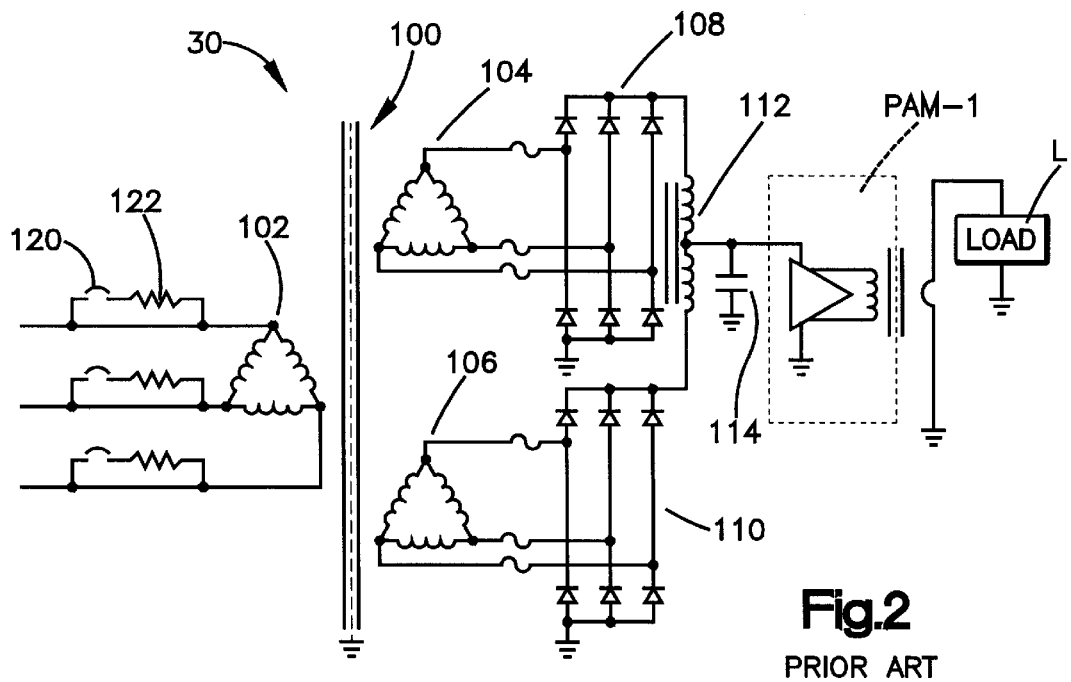
FIG. 2 is a schematic-block diagram illustration of a portion of the circuitry of FIG. 1.
Figure 4:
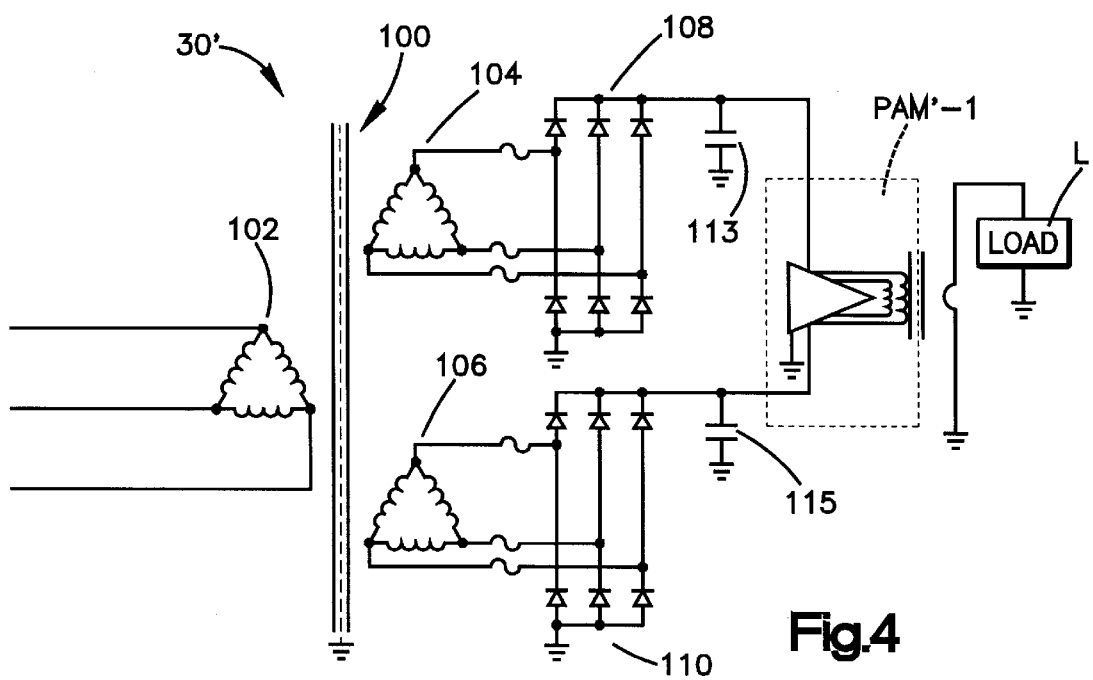
FIG. 4 is a schematic-block diagram illustration of a circuit in accordance with the present invention.
Figure 3:
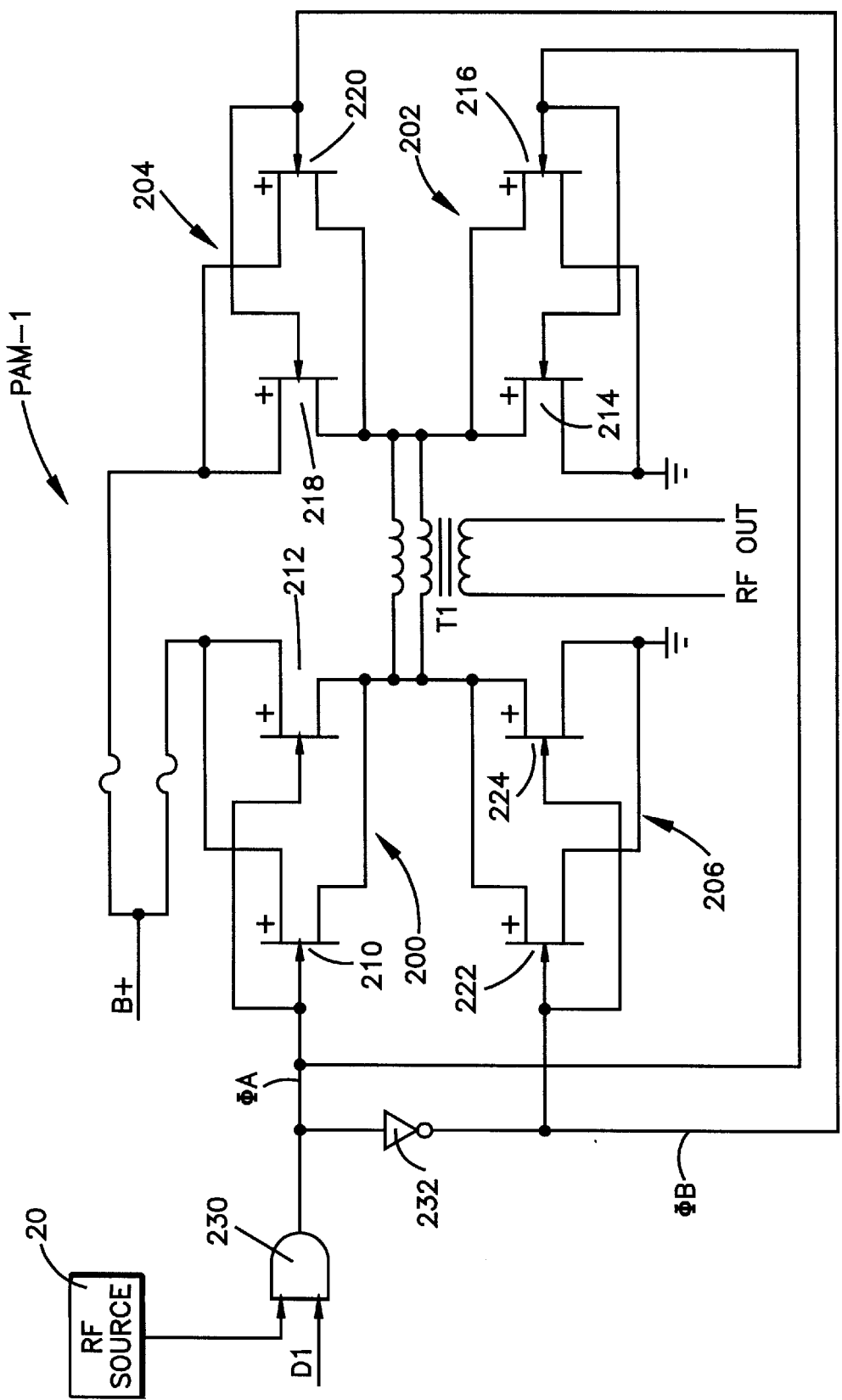
FIG. 3 is a schematic-block diagram illustration of another portion of the circuitry of FIG. 1.
Figure 5:
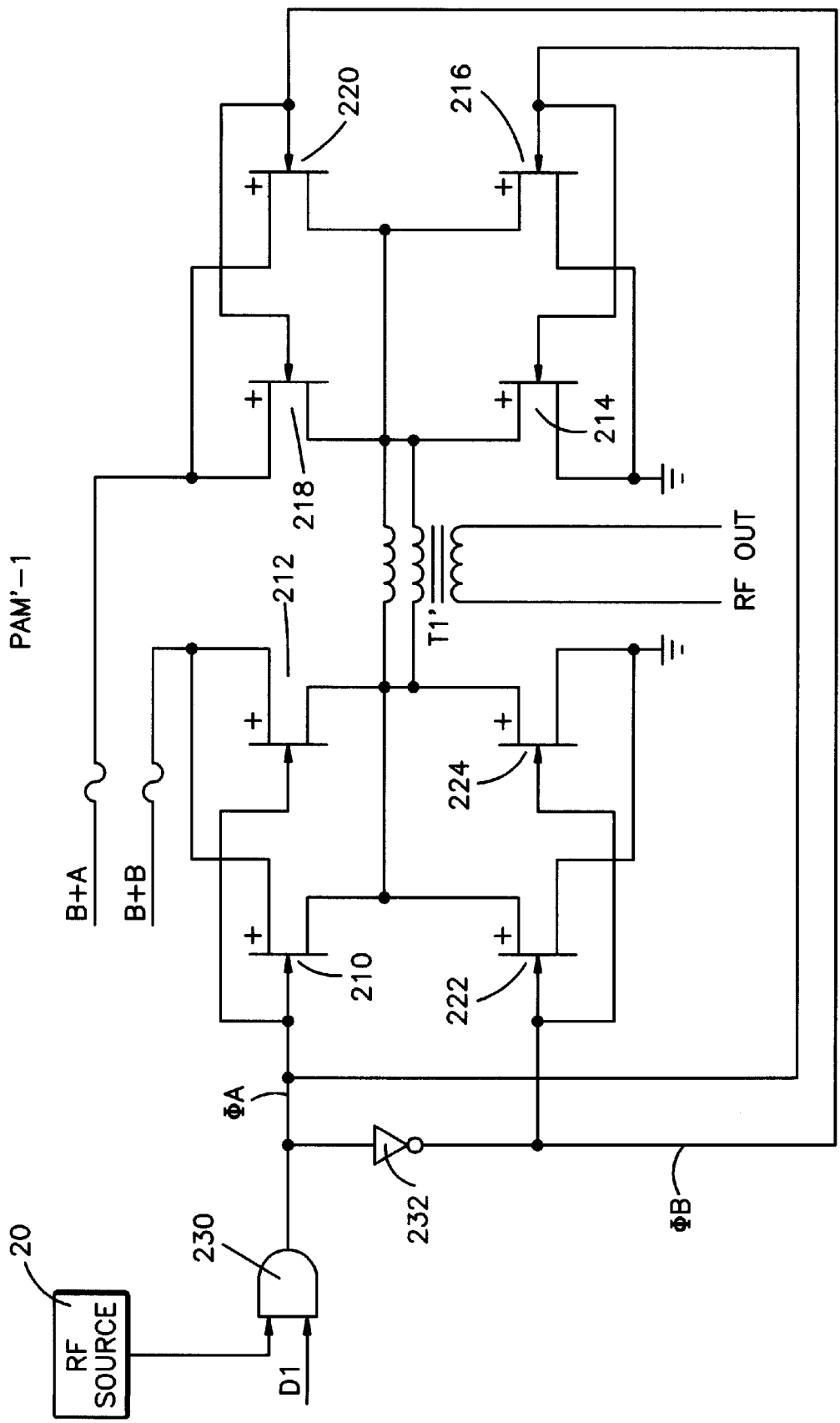
FIG. 5 is a schematic-block diagram illustration of a circuit in accordance with the present invention; and, FIG. 6 is a schematic-block diagram illustration similar to that of FIG. 1 but employing the present invention.
Figure 6:
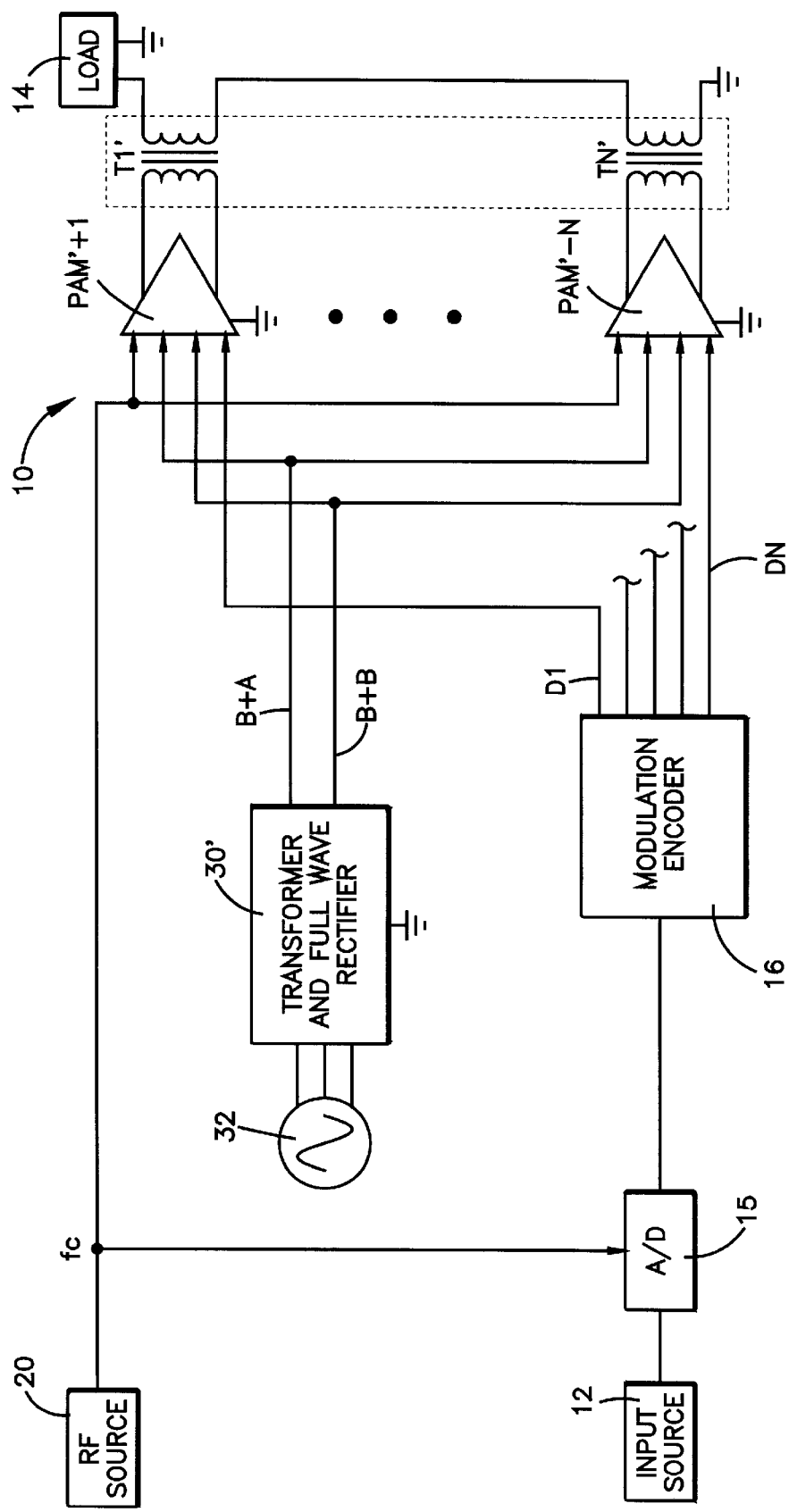

Before describing the preferred embodiment with reference to FIGS. 4, 5, and 6 attention is first directed toward a description of the prior art as represented by FIGS. 1, 2 and 3 to which attention is now directed.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is provided to a load 14, which may take the form of an RF transmitting antenna. A modulation encoder 16 provides a plurality of digital control signals D1 through DN. The control signals are binary signals each having a binary 1 or a binary 0 level. The number of signals having binary 1 or binary 0 levels is dependent upon the instantaneous level of the input signal which is digitized by an analog to digital converter 15.

Each of the output control signals D1-DN is supplied to one of a plurality of N RF power amplifier modules PAM-1 to PAM-N. The control signals serve to turn associated power amplifier modules either on or off. Thus, if the control signal has a binary 0 level, then its associated amplifier module is inactive and no signal is provided at its output. However, if the control signal is of a binary 1 level, then the power amplifier module is active and an amplified carrier signal is provided at its output. Each power amplifier module has an input connected to a single common RF source 20. The carrier signal may be a squarewave. The amplified carrier signals are supplied to a combiner circuit 24 comprised of a plurality of transformers $T_1, T_2, \ldots, T_N$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

Each of the power amplifier modules PAM-1 through PAM-N provides a big step or unit step voltage based on the B+ voltage supply obtained from a transformer and fullwave rectifier circuit 30 coupled to an AC three phase line source 32.

The transformer and fullwave rectifier 30 illustrated in FIG. 1 has already been described herein with reference to FIG. 2 and requires no further discussion at this point.

Each of the power amplifier modules PAM-1 through PAM-N (see FIG. 1) takes the form as more specifically illustrated in FIG. 3 to which attention is now directed. The amplifier module includes an H bridge circuit having four legs with each leg including a pair of switching transistors connected together in parallel and with the outputs being connected across a pair of transformer primary windings of a transformer $T_1$. The four legs include legs 200, 202, 204 and 206. Each switching transistor takes the form of a MOSFET transformer. Leg 200 includes MOSFET transistors 210 and 212. Leg 202 includes MOSFET transistors 214 and 216. Leg 204 includes MOSFET transistors 218 and 220. Leg 206 includes MOSFET transistors 222 and 224. The output of the H bridge is supplied across two parallel connected primary windings on transformer $T_1$ with the RF output being taken from the secondary winding.

The amplifier module is turned on by a turn on signal D1 from the modulation encoder 16. This is a positive signal and enables AND gate 230. The enabled AND gate passes the RF pulse train from an RF source 20 (see FIG. 1). The RF pulses are employed for gating the MOSFET transistors on and off. The RF pulses passed by the AND gate 230 may be referred to as the φA pulse train and these are used to turn on the MOSFET transistors in legs 200 and 202 so that DC current flows in a first direction through the transformer windings. The RF pulses from the AND gate 230 are applied through an inverter 232 to provide a second RF pulse train referred to as the φB pulse train that is identical to but shifted in phase by 180 degrees from the φA pulse train. The φB pulses turn on the MOSFET transistors in legs 204 and 206 so that DC current flows in a second direction through the transformer windings. This amplifier operation continues so long as a turn on signal D1 enables AND gate 230. The number of power amplifier modules PAM-1 to PAM-N that are turned on is dependent upon the magnitude of the input signal from source 12.

In accordance with the present invention, each power amplifier module includes two amplifiers controlled as a single module. The amplifiers are fed by two DC supplies referred to hereinafter as a B+A supply and a B+B supply. The output voltages of the amplifiers are combined after the DC levels have been converted to RF.

The use of RF combining reduces the voltage balance issue with respect to current sharing. By combining at the RF point, other issues have a much greater influence over the current balance than the actual voltage balance (assuming they are within a few volts of each other). Phase alignment and duty cycle of the RF signal play a much larger role in determining current balance. The issues are controlled and equalized in the RF system thus allowing the two rectifier assemblies to share current without the need for an interphase transformer to force balance them as in the case of the circuitry shown in FIG. 2. The circuitry employed (particularly as noted in FIGS. 4 and 5 to described below) provide a reduction in the total harmonic distortion (THD) from the 15–20% typically seen to less than 10%. Values as low as 8.6% have been measured which approaches the theoretical limit of 7%.

Reference is now made to FIG. 4 which is similar to that of the prior art in FIG. 2 and consequently like components are identified with like character references to simplify the description herein. It is noted that the circuitry of FIG. 4 does not require the step start contactors 120 and the related resistors 122 of the circuit in FIG. 2. Also, the costly interphase transformer 112 has been eliminated. A capacitor 113 is connected across the rectifier assembly 108 and a capacitor 115 is connected across the rectifier assembly 110. The output of the rectifier assembly 108 is referred to herein as a B+A source whereas the output from rectifier assembly 110 is referred to herein as the B+B source. These two DC sources are each six pulse sources, that is, each voltage source has a 360 Hz ripple. The two DC sources are out of phase with each other by 30 degrees. The outputs of the amplifiers are combined at the RF level with a ripple frequency of 720 Hz.

The power amplifier module PAM'-1 of FIG. 5 is similar to that of the prior art power amplifier module PAM-1 of FIG. 3 and only the differences will be described in detail herein. This power amplifier module receives a turn on control signal $D_1$ to enable an AND gate 230 to pass the φA pulses and by way of inverter 232 to also pass φB pulses to the MOSFET transistors.

It is to be noted that the B+A voltage source is supplied to MOSFETs 218 and 220 for current to flow in a first direction through the primary windings of transformer T'₁. The voltage source B+B supplies MOSFET transistors 210 and 212 for DC current flow in the opposite direction through the primary windings of the transformer T'₁.

In the power amplifier module PAM-1 in FIG. 3, a single H bridge network is provided with a pair of MOSFETs being connected together in parallel in each leg. Both half bridges are supplied by the same DC voltage source (B+). In the circuit of FIG. 5, each half bridge is supplied by one of the B+ voltage sources. During each RF cycle the B+A source provides half the current and the B+B source provides the other half, ensuring perfect loading for both rectifier networks.

Reference is now made to FIG. 6 which is similar to that of FIG. 1 and corresponding components are identified with like character references to simply the description herein. The transformer and fullwave rectifiers 30' of FIG. 6 are constructed as the circuit 30' of FIG. 4 which provides two DC sources B+A and B+B each having a 360 Hz ripple voltage. The two voltage sources are connected to each of the power amplifier modules PAM'-1 to PAM'-N. Each of these power amplifier modules is constructed in the same manner as module PAM'-1 illustrated in FIG. 5. The primary windings on transformer T'₁ in FIG. 5 and FIG. 6 may take the form of a twisted pair wound about a toroid.

The improved circuitry obviates the need for step start controllers on the front end while still employing 12-pulse transformer operation while eliminating the need for an interphase transformer.

Although the invention has been described in conjunction with a preferred embodiment, it is to be appreciated that various modifications may be made without departing from the spirit and scope of the invention as defined by the appended claims.

Having described the invention we claim:

1. An RF power amplifier system comprising:
   an RF source providing an RF carrier signal having a given RF carrier frequency;
   an RF amplifier module that amplifies said carrier signal and wherein said module includes first and second RF amplifiers having a common input to receive a turn on signal to turn on both amplifiers and having their outputs coupled together in parallel;
   a controller that supplies a said turn on signal to said common input to turn on said first and second amplifiers;
   a first AC to DC supply for supplying a first DC operating voltage from a first multi-phase AC supply to said module and wherein said first DC voltage exhibits a ripple frequency dependent upon the number of phases in said first multi-phase supply; and,
   a second AC to DC supply for supplying second DC operating voltage from a second multi-phase AC supply to said module and wherein said second DC operating voltage exhibits a ripple frequency dependent upon the number of phases in said second multi-phase supply.

2. An RF power amplifier system as set forth in claim 1 wherein said first AC to DC supply is a first multi-phase secondary winding network and said second AC to DC supply is a second multi-phase secondary winding network, said first and second multi-phase secondary winding networks being transformer coupled to a multi-phase primary winding network adapted for connection to a multi-phase line voltage source.

3. An RF power amplifier system as set forth in claim 2 wherein each multi-phase is 3 phase.

4. An RF power amplifier system as set forth in claim 1 including N said RF amplifier modules and wherein said controller has N control lines each connected to a said common input of one of said N RF amplifier modules for selectively supplying a said turn on pulse to one or more of said modules.

5. An RF power amplifier system as set forth in claim 4 wherein said first AC to DC supply is a first multi-phase secondary winding network and said second AC to DC supply is a second multi-phase secondary winding network, said first and second multi-phase secondary winding networks being transformer coupled to a multi-phase primary winding network adapted for connection to a multi-phase line voltage source.

6. An RF power amplifier system as set forth in claim 5 wherein said number of phases is the same at each of said first and second AC to DC supplies.

7. An RF power amplifier system as set forth in claim 6 wherein said number of phases is 3.

8. An RF power amplifier system as set forth in claim 1 wherein each said RF amplifier is an H bridge amplifier having four legs, each said leg containing a switching transistor.

9. An RF power amplifier system as set forth in claim 8 wherein two of said legs in each amplifier form a first circuit connected to said first supply and the other two of said legs in each amplifier form a second circuit connected to said second supply.

10. An RF power amplifier system as set forth in claim 9 wherein said first circuit in said first amplifier is connected in parallel with said first circuit in said second amplifier.

11. An RF power amplifier system as set forth in claim 10 wherein said second circuit in said first amplifier is connected in parallel with said second circuit in said second amplifier.

12. An RF power amplifier system comprising:
    an RF source providing an RF carrier signal having a given RF carrier frequency;
    an RF amplifier module that amplifies said carrier signal and wherein said module includes at least an RF amplifier having an input to receive a turn on signal to turn on said amplifier and having an output;
    a controller that supplies a said turn on signal to said input to turn on said amplifier;
    a first AC to DC supply for supplying a first DC operating voltage from a first multi-phase AC supply to said module and wherein said first DC voltage exhibits a ripple frequency dependent upon the number of phases in said first multi-phase supply; and,
    a second AC to DC supply for supplying a second DC operating voltage from a second multi-phase AC supply to said module and wherein said second DC operating voltage exhibits a ripple frequency dependent upon the number of phases in said second multi-phase supply.

13. An RF power amplifier system as set forth in claim 12 wherein said first AC to DC supply is a first multi-phase secondary winding network and said second AC to DC supply is a second multi-phase secondary winding network, said first and second multi-phase secondary winding networks being transformer coupled to a multi-phase primary winding network adapted for connection to a multi-phase line voltage source.

14. An RF power amplifier system as set forth in claim 13 wherein each multi-phase is 3 phase.

15. An RF power amplifier system as set forth in claim 13 including N said RF amplifier modules and wherein said controller has N control lines each connected to a said common input of one of said N RF amplifier modules for selectively supplying a said turn on pulse to one or more of said modules.

16. An RF power amplifier system as set forth in claim 12 wherein said RF amplifier is an H bridge amplifier having four legs, each said leg containing a switching transistor.

17. An RF power amplifier system as set forth in claim 16 wherein two of said legs form a first circuit connected to said first supply and the other two of said legs form a second circuit connected to said second supply.

18. An RF power amplifier system as set forth in claim 17 wherein said first circuit in said first amplifier is connected in parallel with said first circuit in said second amplifier.

19. An RF power amplifier system as set forth in claim 18 wherein said second circuit in said first amplifier is connected in parallel with said second circuit in said second amplifier.

* * * * *